United States Patent [19]

Henry

[11] Patent Number: 5,034,795
[45] Date of Patent: Jul. 23, 1991

[54] ELECTRICALLY INSULATING SUBSTRATE

[75] Inventor: Yves Henry, Eybens, France

[73] Assignee: Thomson Tubes Electroniques, Boulogne Billancourt, France

[21] Appl. No.: 434,034

[22] Filed: Nov. 9, 1989

[30] Foreign Application Priority Data

Nov. 10, 1988 [FR] France ............... 88 14674

[51] Int. Cl.$^5$ ............................................. H01L 27/14
[52] U.S. Cl. ..................................... 357/30; 357/17; 357/2; 357/23.7; 357/52; 357/54; 350/339 R; 350/342
[58] Field of Search ................. 357/30 K, 30 P, 30 H, 357/17, 2, 23.7, 52, 52 D, 54; 350/339 R, 342

[56] References Cited

U.S. PATENT DOCUMENTS

| | | | |
|---|---|---|---|
| 4,187,336 | 2/1980 | Gorgon | 428/34 |
| 4,329,699 | 5/1982 | Ishibara et al. | 357/30 K X |
| 4,451,838 | 5/1984 | Yamazaki | 357/2 |
| 4,478,654 | 10/1984 | Gau et al. | 357/30 K X |
| 4,827,117 | 5/1989 | Uchida et al. | 357/30 K X |
| 4,920,387 | 4/1990 | Takasu et al. | 357/17 |

FOREIGN PATENT DOCUMENTS

| | | |
|---|---|---|
| 0154482 | 9/1985 | European Pat. Off. . |
| 0275662 | 7/1988 | European Pat. Off. . |
| 3423159 | 1/1985 | Fed. Rep. of Germany . |
| 57-62053 | 4/1982 | Japan . |

OTHER PUBLICATIONS

Patent Abstracts of Japan, vol. 1, No. 145, Nov. 25, 1977, p. 7279 E 77; & JP-A-52 82 442, 09-07-1977, T. Imai, "Glass Electode Substrate for Liquid Crystal Display Unit".

Primary Examiner—William Mintel
Attorney, Agent, or Firm—Oblon, Spivak, McClelland, Maier & Neustadt

[57] ABSTRACT

Disclosed is a substrate particularly designed to bear an active structure made according to thin-film technology. The advantage of the disclosed substrate is that it can be made in large sizes and at low cost. To this end, the substrate 1 has an soda-lime glass plate passivated by means of two superimposed layers. The layer in contact with the glass plate is a barrier layer against the alkaline constituents and the layer deposited on the barrier layer has the function of preventing the effect, on the barrier layer, of the products designed to etch the elements that form the active structure.

6 Claims, 1 Drawing Sheet

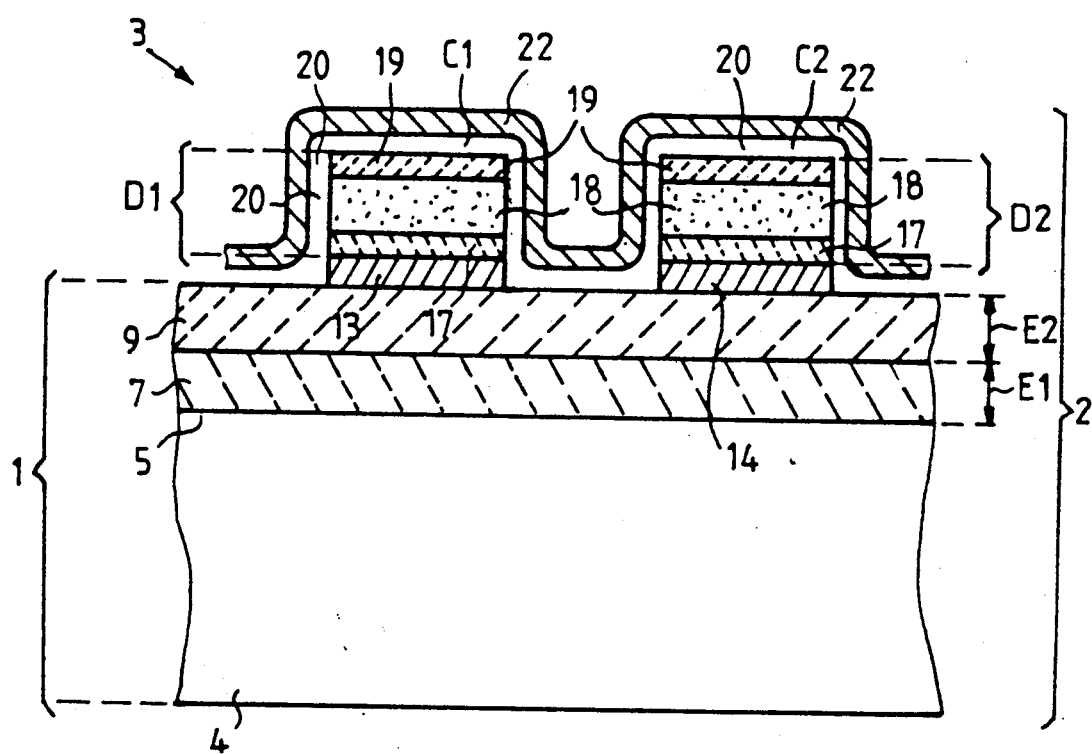

ELECTRICALLY INSULATING SUBSTRATE

BACKGROUND OF THE INVENTION

1. Field of the Invention

The invention concerns an electrically insulating substrate, made of glass notably, the valuable feature of this substrate being that it be made with a large area, and in a simple and economical fashion. The substrate according to the invention can be advantageously applied, for example, to the field of liquid crystal display panels or, again, to the field of devices coming under thin film technology such as array type or surface type solid state photosensitive devices or, again, surface structures of hydrogenated amorphous silicon carbide based electroluminescent diodes.

2 Description of the Prior Art

In these different fields, the making of large area substrates raise problems of varying acuteness, depending on the field concerned.

If we take, for example, the case of a surface type image detector, formed by a matrix arrangement of photosensitive dots made with amorphous silicon according to thin film technology, such an image detector usually has to be large in size, with dimensions of up to 40 cm×40 cm for example. The standard practice in this type of application is to use glass substrates that are free of alkaline constituents in their composition. One of the most common substrates of this kind is a barium borosilicate marketed by the firm CORNING under the reference 7059.

This type of glass has drawbacks that make it difficult to use it in industrial conditions. For, it is a hard glass and is, consequently, very brittle at the edges and gets easily flaked. The particles that thus get detached go on to the surface and scratch it and/or tend to alter or disturb the active structure (forming the detector) that is deposited on the glass. This leads to a great many localized faults. Moreover, as this glass is very hard, it is very difficult to cut it, and it often gets broken when it has to be cut into sections with large areas, notably of 40 cm×40 cm. This tends to increase costs, whereas the purchase of this glass already entails a very high cost in view of the criteria of planeity that are required.

However, there are soda-lime type glasses called window glasses which are easy to cut and widely available in the market. But this type of glass has the drawback of being rich in sodium oxide. If, for example, amorphous silicon is deposited on a support or substrate made of glass of a such a type, the alkaline constituents present in the glass get diffused in the amorphous silicon and, consequently, the active structure attached to this substrate ages poorly and gets detached from its support after a few months.

In a standard approach to this problem, the glass is passivated by depositing a protective layer, called a barrier layer, on its surface. This barrier layer is thus interposed between the glass and the first layer of the active structure for which the glass acts as a support. The function of the barrier layer is to act as a barrier to the undesirable products contained in the glass support, i.e., in this case, its function is to prevent the diffusion of the alkaline constituents in the amorphous silicon.

In this spirit, it is possible to use soda-lime glass passivated with silica (the silica layer being generally deposited in using a liquid phase of a metal-organic silicon compound). However, the substrate made of soda-lime glass treated in this way is made only in very small quantities and it is consequently very difficult to procure supplies of it for industrial-scale manufacture.

SUMMARY OF THE INVENTION

The present invention concerns a substrate that does not have the above-mentioned drawbacks. The substrate according to the invention is made with a soda-lime type glass comprising a barrier layer against the alkaline constituents, and the composition of the barrier layer is such that it notably has the advantage wherein it can be made with means similar to those used for the deposition of amorphous silicon layers.

According to the invention, there is proposed an electrically insulating substrate comprising a soda-lime type glass plate wherein at least one surface of the glass plate is coated with at least one barrier layer against the alkaline constituents of the glass plate, and wherein at least one etch-resistant layer is deposited on the barrier layer.

BRIEF DESCRIPTION OF THE DRAWINGS

The invention will be better understood from the following description, made as a non-restrictive example, with reference to the single appended figure which gives a schematic cross-sectional view of a substrate according to the invention bearing an active substrate.

DESCRIPTION OF THE PREFERRED EMBODIMENT

The figure gives a schematic view, as a non-restrictive example, of a substrate 1 according to the invention, used in a photosensitive substrate 2, that is, the substrate 1 has an active structure 3 which is a photosensitive structure (by active structure, we mean any element for which the substrate 1 may act as a support).

The substrate 1 is made from a soda-lime type of glass plate 4.

According to one characteristic of the invention, firstly, a face 5 of the glass plate 4, oriented towards the active structure 3, is coated with at least one barrier layer 7 that acts as a barrier to the alkaline constituents and is therefore designed to prevent the diffusion of the alkalis in the active structure 3. Secondly, the barrier layer 7 is itself coated with at least one layer 9 called an etch-resistant layer which is thus deposited between the barrier layer 7 and the active structure 3.

The term "barrier layer against alkaline constituents" is used to define a layer of any material capable of preventing the diffusion, towards the active structure 3, of the alkaline constituents, contained in the soda-lime glass plate 4. This material, capable of forming the barrier layer 7, is for example amorphous hydrogenated carburated silicon $a-Si_{1-x}C_x:H$, or again amorphous hydrogenated silicon nitride $a-Si\ N_z:H$.

It has to be further noted that the term "etch-resistant layer" is used to define a layer of any material that cannot be etched by the same gas mixtures or products as those used for the etching of the elements of the active structure 3 and, notably, for the etching of amorphous silicon, or those for which the process of attack by these mixtures occurs far more slowly. Thus, for example, the etch-resistant layer 9 may be a layer of hydrogenated amorphous silica $a-Si\ O_y:H$ (which well withstands etching by standard etching methods in microelectronics used for amorphous silicon and metals, notably wet etching and plasma etching) or again, for example, a layer of hydrogenated amorphous silicon oxynitride a-Si $O_uN_{1-u}$:H with u close to 1.

The substrate 1 can be made in the manner explained hereinafter. The soda-lime glass plate 4 is cleaned by known methods. The glass plate 4 is then introduced into a chamber of a reactor of the type used for PECVD (plasma enhanced chemical vapor deposition) where the glass plate 4 is carried to a temperature, for example of the order of 200 degrees C. to 300 degrees C.

In a preferred version of the invention, a mixture of ethylene $C_2H_4$ and silane $SiH_4$ is excited by a radiofrequency wave, at 13.56 MHz for example, for a period that is determined, in a manner that is standard per se, by the thicknesses of the deposits to be obtained. Thus, a layer of amorphous hydrogenated carburated silicon a-$Si_{1-x}C_x$:H is deposited.

The composition of this material forming the barrier layer 7 may preferably vary, for example, from x=0.55 to x=0.75, corresponding to a composition of the gas mixture $C_2H_4/C_2H_4+Si H_4)=0.8$ to 0.9 respectively (it must be noted, nonetheless, that satisfactory values have been noted for values of x between 0.5 and 1). The forbidden band widths $E_g$ of the material forming the barrier layer 7 vary from $E_g=2.6$ eV for x=0.55 to Eg=2.8 eV for x=0.75. These values are useful for obtaining good electrical insulation (resistivity greater than $1.10^{10}$ ohm-cm in darkness).

The thickness E1 of the barrier layer 7 made of amorphous hydrogenated carburated silicon may range, for example, from 0.5 to 1 millimeter and, in this range of thickness, it makes it possible to obtain an excellent coating of the surface faults of the glass plate 4.

It must be noted that the ethylene may be replaced by methane $CH_4$ but, in this case, the value of x that can be achieved does not far exceed 0.6.

The barrier layer 7 of amorphous hydrogenated carburated silicon 7 is then coated with the etch-resistant layer 9 made of hydrogenated amorphous silicon. This etch-resistant layer has, for example, a thickness E2 of the order of one micrometer, and is deposited by a standard method of deposition as in the case of the deposition of the barrier layer 7, that is, by a method of chemical vapor deposition for example, using a mixture of silane $SiH_4$ and nitrogen monoxide $N_2O$.

The value of the deposition of the barrier layer 7 on the glass plate 4, then of the deposition of the etch-resistant layer 9, which is thus located between the barrier layer 7 and the active structure 3, lies in the fact that the highly effective coating of the surface faults of the glass plate 4 by the barrier layer 7 of amorphous hydrogenated carburated silicon makes it possible to obtain an efficient barrier against the diffusion of the sodium (it can be noted that the layer made of amorphous hydrogenated carburated silicon is more dense than silica). The gaps are occupied by hydrogen which remains stable so long as the following procedures (to make the active structure 3) are done at a temperature equal to or lower than that of barrier layer 7 made of amorphous hydrogenated carburated silicon. By contrast, this material which forms the barrier layer 7 can be etched by the same methods, i.e. by the same mixtures as those enabling the etching of the amorphous silicon so that, during the fabrication of the active structure 3 or detecting structure, the glass of the plate 4 can be again bared. Thus, the layer of hydrogenated amorphous silica a-$SiO_y$:H has the role of isolating the barrier layer 7 from the etching gases designed to etch the amorphous silicon of the active structure 3. The amorphous silica of the etch-resistant layer 9 does not get etched, or gets etched very slowly, by the same gas mixtures as those designed for the etching of the amorphous silicon.

The glass plate 4, thus treated, forms the substrate 1 which may then be used as an ordinary substrate for the entire sequence of operations for making the active structure 3.

In the non-restrictive example described, the active structure 3, deposited on the etch-resistant layer 9, corresponds to a structure described in a French patent No; 86.00716 which relates to a matrix of photosensitive elements comprising a network of row conductors and a network of column conductors having, at each intersection of a row and a column, a photosensitive dot formed by a photodiode in series with a capacitor. Clearly, the substrate of the invention may be applied equally well to photosensitive dots with different structures.

Thus taking, for example, the structure described in the above-mentioned patent, there is a metallic layer on top of the etch-resistant layer 9. This metallic layer is etched so as to form column conductors 13, 14 which extend in a plane perpendicular to that of the figure (only two conductors are shown to simplify the figure). A diode D1, D2, of the PIN type for example, is formed by the deposition, on the column conductors 13, 14, of three amorphous silicon layers, 17, 18, 19, respectively having P type (layer 17), intrinsic type (layer 18) and N type (layer 19) doping. An insulator layer 20 is deposited on the whole set of diodes D1, D2. This layer 20 forms the dielectric of a capacitor C1, C2, previously referred to as being in series with the photodiode D1, D2. Then there is a preferably transparent, conductive metallic layer which is deposited on the insulator layer 20 and etched to form row conductors 22 of the matrix (a single row conductor 22, seen in a sectional view is shown in the figure). Of course, the active structure 3 that has just been described is standard per se and, in the spirit of the invention, the substrate 1 according to the invention may act as a substrate for different assemblies and applications.

As mentioned earlier, in one variant of the invention, the barrier layer 7 may be formed by using hydrogenated silicon nitride a-$SiN_2$:H which also has excellent ability to coat the surface faults of the glass as well as excellent dielectric rigidity, and forms an efficient barrier to the diffusion of sodium.

However, the layers of hydrogenated silicon nitride are always under great stress, and this results in losses of adhesion of the detector structures or active structures 3 on the entire surface or on a part of it. The hydrogenated silicon nitride is highly compressed with respect to the glass, the value of the stress in the layer being about $-3\ 10^{10}$ Dyn/cm2 for a thickness of about 0.3 micrometers.

However, the barrier layer 7 is itself coated with an etch-resistant layer 9 made of hydrogenated amorphous silica so that, should the barrier layer 7 be made of hydrogenated silicon nitride, the following etch-resistant layer 9 makes it possible to obtain a set formed by these two layers 7, 9, which thereafter is under only very light compression.

Thus, a first deposition of a barrier layer 7, made of hydrogenated silicon nitride a-Si $N_z$ is made in a manner that is standard per se, at a temperature in the range of 200 degrees C. to 300 degrees C., with a thickness E1 of about 0.3 micrometer. This deposition of the barrier layer 7, made of hydrogenated silicon nitride, is followed by the deposition of the etch-resistant layer 9 with a thickness E2 of about 0.6 micrometers in this latter case, i.e. with a thickness that is appreciably greater than the thickness E1 of the barrier layer 7 made of hydrogenated silicon nitride. As mentioned above, both the layers 7, 9 are then under very slight compression of about $-4 \cdot 10^8$ Dyn/cm2. There then is a substrate 1 formed from a passivated soda-lime glass compatible with the adhesion of the layers of the active structures 3.

The substrate according to the invention can be used advantageously in all cases where it has to be made with a large size, using glass, and where it is necessary to prevent any contamination of the elements for which this substrate acts as a support. Thus, for example, the substrate of the invention can be used in a particularly useful way as a support for a device implementing thin-film technology, notably with the use of amorphous silicon as in the case of photosensitive detectors.

What is claimed is:

1. An electrically insulating substrate, comprising:
   a soda-lime type glass plate;
   at least one barrier layer formed of amorphous hydrogenated carburated silicon a-Si$_{1-x}$C$_x$:H, wherein x ranges from 0.5 to 1 or of a hydrogenated silicon nitride a-SiN$_z$:H on at least one surface of the glass plate, which forms a barrier against the alkaline constituents of the glass plate; and
   at least one etch-resistant layer formed of a hydrogenated amorphous silica a-SiO$_y$:H, or of a hydrogenated amorphous silicon oxynitride a-SiO$_u$N$_{1-u}$:H deposited on said at least one barrier layer.

2. The insulating substrate of claim 1, wherein the thickness of said etch-resistant layer formed of hydrogenated amorphous silica is greater than the thickness of the barrier layer.

3. The insulating substrate of claim 2, wherein said barrier layer is deposited on the glass plate by chemical vapor deposition.

4. A device of the thin-film type formed from the insulating substrate of claim 1.

5. A photosensitive detector comprising amorphous silicon formed of the insulating substrate of claim 1.

6. An electroluminescent diode device formed of silicon carbide and the insulating substrate of claim 1.

* * * * *